United States Patent
Cader et al.

(10) Patent No.: US 8,076,951 B2
(45) Date of Patent: Dec. 13, 2011

(54) SPRAY COOLING THERMAL MANAGEMENT SYSTEM AND METHOD FOR SEMICONDUCTOR PROBING, DIAGNOSTICS, AND FAILURE ANALYSIS

(75) Inventors: Tahir Cader, Pullman, WA (US); Charles Lester Tilton, Colton, WA (US); Benjamin Hewett Tolman, Moscow, ID (US); George Joseph Wos, Colton, WA (US); Alan Brent Roberts, Moscow, ID (US); Thomas Wong, Menlo Park, CA (US); Jonathan D. Frank, Los Gatos, CA (US)

(73) Assignees: DCG Systems, Inc., Fremont, CA (US); Isothermal Systems Research, Inc., Clarkston, WA (US)

( * ) Notice: Subject to any disclaimer, the term of this patent is extended or adjusted under 35 U.S.C. 154(b) by 0 days.

(21) Appl. No.: 12/402,475

(22) Filed: Mar. 11, 2009

(65) Prior Publication Data

US 2009/0173476 A1    Jul. 9, 2009

Related U.S. Application Data

(62) Division of application No. 11/205,898, filed on Aug. 16, 2005, now Pat. No. 7,504,845, which is a division of application No. 10/222,107, filed on Aug. 16, 2002, now Pat. No. 7,102,374.

(51) Int. Cl.
*G01R 31/26* (2006.01)
*G01R 31/10* (2006.01)

(52) U.S. Cl. ......... 324/750.08; 324/750.03; 324/705.05; 324/750.09; 324/762.01; 257/48; 438/14; 165/104.33

(58) Field of Classification Search .................. 324/760, 324/750.1–750.15, 762.01–762.05; 165/30; 438/14–18; 257/48
See application file for complete search history.

(56) References Cited

U.S. PATENT DOCUMENTS 4,680,635 A    7/1987   Khurana
(Continued)

FOREIGN PATENT DOCUMENTS

JP    05166912    7/1993

OTHER PUBLICATIONS

Backside Silicon Integrated Circuit Infrared Immersion Lens/Heat Sink; IBM Technical Disclosure Bulletin; vol. 35, No. 7, Dec. 1992; ISSN 0018-8689.

(Continued)

*Primary Examiner* — Huy Q Phan
*Assistant Examiner* — Emily Y Chan
(74) *Attorney, Agent, or Firm* — Nixon Peabody LLP; Joseph Bach, Esq.

(57) ABSTRACT

A micro-spray cooling system beneficial for use in testers of electrically stimulated integrated circuit chips is disclosed. The system includes micro-spray heads disposed about a probe head. The spray heads and probe head are disposed in a sealed manner inside a spray chamber that, during operation, is urged in a sealing manner onto a sealing plate holding the integrated circuit under test. The atomized mist cools the integrated circuit and then condenses on the spray chamber wall. The condensed fluid is pumped out of the chamber and is circulated in a chiller, so as to be re-circulated and injected again into the micro-spray heads. The pressure inside the spray chamber may be controlled to provide a desired boiling point.

13 Claims, 3 Drawing Sheets

U.S. PATENT DOCUMENTS

| | | | |
|---|---|---|---|
| 4,811,090 | A | 3/1989 | Khurana |
| 4,870,355 | A | 9/1989 | Kufis et al. |
| 4,897,762 | A | 1/1990 | Daikoku et al. |
| 5,004,307 | A | 4/1991 | Kino et al. |
| 5,070,040 | A | 12/1991 | Pankove |
| 5,208,648 | A | 5/1993 | Batchelder et al. |
| 5,220,804 | A | 6/1993 | Tilton et al. |
| 5,282,088 | A | 1/1994 | Davidson |
| 5,285,351 | A | 2/1994 | Ikeda |
| 5,349,831 | A | 9/1994 | Daikoku et al. |
| 5,361,032 | A | 11/1994 | Waterbly |
| 5,408,189 | A * | 4/1995 | Swart et al. .................. 324/758 |
| 5,475,316 | A | 12/1995 | Hurley et al. |
| 5,515,910 | A | 5/1996 | Hamilton et al. |
| 5,579,826 | A | 12/1996 | Hamilton et al. |
| 5,940,545 | A | 8/1999 | Kash et al. |
| 6,140,141 | A * | 10/2000 | Davidson .................. 438/16 |
| 6,498,725 | B2 | 12/2002 | Cole et al. |
| 6,571,569 | B1 | 6/2003 | Rini et al. |
| 6,608,494 | B1 | 8/2003 | Bruce et al. |
| 6,621,275 | B2 | 9/2003 | Cotton et al. |
| 6,788,093 | B2 | 9/2004 | Aitren et al. |
| 2003/0098692 | A1 * | 5/2003 | Cotton et al. .................. 324/537 |

OTHER PUBLICATIONS

PCT International Search Report for PCT/US03/36547 dated Mar. 29, 2004.

Office Action for Japanese Patent Application No. 2004-569209 dated Aug. 25, 2009.

Office Action for Chinese Patent Application No. 200380110110.3 dated Nov. 23, 2007.

Office Action for European Patent Application No. 03783539.4 dated Feb. 22, 2006.

Office Action for European Patent Application No. 03783539.4 dated Jul. 23, 2007.

N. Khurana, et al., "Analysis of Product Hot Electron Problems by Gated Emission Microscopy," IEEE, Reliability Physics Symposium, Apr. 1986.

* cited by examiner ly well suited for optical microscopy. The use of synthetic diamond to enhance cooling is

SPRAY COOLING THERMAL MANAGEMENT SYSTEM AND METHOD FOR SEMICONDUCTOR PROBING, DIAGNOSTICS, AND FAILURE ANALYSIS

This application is a Divisional of, and claims priority from, U.S. application Ser. No. 10/222,107, filed Aug. 16, 2002.

BACKGROUND OF THE INVENTION

1. Field of the Invention

The present invention relates to a system and a method for thermal management of an electrically stimulated semiconductor integrated circuit undergoing probing, diagnostics, or failure analysis.

2. Description of the Related Art

Integrated circuits (ICs) are being used in increasing numbers of consumer devices, apart from the well-known personal computer itself. Examples include automobiles, communication devices, and smart homes (dishwashers, furnaces, refrigerators, etc.). This widespread adoption has also resulted in ever larger numbers of ICs being manufactured each year. With increased IC production comes the possibility of increased IC failure, as well as the need for fast and accurate chip probing, debug, and failure analysis technologies. The primary purpose of today's probing, debug, and failure analysis systems is to characterize the gate-level performance of the chip under evaluation, and to identify the location and cause of any operational faults.

In the past, mechanical probes were used to quantify the electrical switching activity. Due to the extremely high circuit densities, speeds, and complexities of today's chips, including the use of flip-chip technology, it is now physically impossible to probe the chips mechanically without destructively disassembling them. Thus, it is now necessary to use non-invasive probing techniques for chip diagnostics. Such techniques involve, for example, laser-based approaches to measure the electric fields in silicon, or optically-based techniques that detect weak light pulses that are emitted from switching devices, e.g., field-effect transistors (FETs), during switching. Examples of typical microscopes for such investigations are described in, for example, U.S. Pat. Nos. 4,680,635; 4,811,090; 5,475,316; 5,940,545 and Analysis of Product Hot Electron Problems by Gated Emission Microscope, Khurana et al., IEEE/IRPS (1986), which are incorporated herein by reference.

During chip testing, the chip is typically exercised at relatively high speeds by a tester or other stimulating circuit. Such activity results in considerable heat generation. When the device is encapsulated and is operated in its normal environment, various mechanisms are provided to assist in heat dissipation. For example, metallic fins are often attached to the IC, and cooling fans are provided to enhance air flow over the IC. However, when the device is under test, the device is not encapsulated and, typically, its substrate is thinned down for testing purposes. Consequently, no means for heat dissipation are available and the device under test (DUT) may operate under excessive heat so as to distort the tests, and may ultimately fail prematurely. Therefore, there is a need for effective thermal management of the DUT.

One prior art system used to cool the DUT is depicted in FIG. 1. The cooling device 100 consists of a cooling plate 110 having a window 135 to enable optical probing of the DUT. The window 135 may be a simple cut out, or may be made of thermally conductive transparent material, such as synthetic diamond. The use of synthetic diamond to enhance cooling is described in, for example, U.S. Pat. No. 5,070,040, which is incorporated herein by reference. Conduits 120 are affixed to the cooling plate 110 for circulation of cooling liquid. Alternatively, the conduits may be formed as an integral part of the plate.

FIG. 1 depicts in broken line a microscope objective 105 used for the optical inspection, and situated in alignment with the window 135. During testing, the cooling plate is placed on the exposed surface of the DUT 160, with the window 135 placed over the location of interest. Heat from the device is conducted by the cooling plate to the conduits and the cooling liquid. The cooling liquid is then made to circulate through a liquid temperature conditioning system, such as a chiller, thereby removing the heat from the device. Typically, however, the DUT includes auxiliary devices 165, which limit the available motion of the cooling plate, thereby limiting the area available for probing To overcome this, custom plates are made for specific devices, leading to increased cost and complexity of operation of the tester.

There is a need for an innovative, inexpensive, flexible, and thermally effective thermal management solution for chip testers or probers.

SUMMARY OF THE INVENTION

The present invention provides a mechanism for removing heat from a DUT, thereby allowing for inspection of the device under electrical stimulation. Therefore, the system is particularly adaptable for use with optical microscopes used for probing, diagnostics and failure analysis of the DUT.

In one aspect of the invention, a thermal management system is provided which utilizes an atomized liquid spray for removing heat from the DUT. A spray head is provided about an objective lens housing, and this arrangement is placed inside a spray chamber. The spray chamber is sealed to a plate upon which the DUT is situated. The pressure inside the chamber may be controlled to obtain the proper evaporation of the sprayed liquid. Pressure transducers and temperature sensors may be installed on the pressure chamber to monitor the operation of the thermal management system.

In another aspect of the invention, the spray cooling is accomplished using several banks of atomizers. According to one implementation, all of the atomizers are commonly connected to one liquid supply. On the other hand, according to other implementations, liquid delivery to each, or to groups, of atomizers may be controlled separately so as to vary the pressure, the timing, and/or the type of liquid delivered to various atomizers.

In a further aspect of the invention, control instrumentation is provided for accurate operation of the thermal management system. The DUT temperature can be controlled via coolant temperature, coolant flow rate (directly tied to coolant delivery pressure), and coolant boiling point (a function of spray chamber pressure and vapor temperature. Note that at its saturation temperature, the temperature of the saturation liquid is the same as its vapor (non-superheated). A temperature sensor close to the coolant delivery point monitors the coolant delivery temperature, which is fed back to the thermal management system's controller. The controller controls the liquid temperature conditioning system, which may be a chiller or other device to control the coolant's temperature to a pre-determined value. Such systems are well known to those skilled in the art.

Spray chamber pressure is measured with a pressure transducer in communication with the spray chamber. Vapor temperature (measured with a temperature sensor in communication with the spray chamber) and spray chamber pressure determine the coolant's boiling point, which in turn influences the manner in which the DUT temperature is controlled. The spray chamber pressure can be manipulated to influence the coolant's boiling point. The spray chamber pressure may be affected, for example, by a solenoid valve in communication with the spray chamber, by adjusting the return pump's speed, or by manipulating the pressure inside the liquid temperature conditioning system's reservoir. A mechanical pressure relief valve provides a safety release in the event that the solenoid valve fails.

One or more of the afore-mentioned approaches, individually or in combination, may be used to control the coolant flow rate and/or the coolant's boiling point. The ultimate goal is to use the instrumentation to control the DUT to a pre-determined temperature. The temperature of the DUT may be measured by mechanical contact with a thermocouple or other sensor, by non-contact means such as a thermal imaging camera, or by any other means suitably accurate for the intended temperature stability. Any means for measuring the DUT temperature may be employed in the control of the DUT temperature. The specific examples given here are meant for illustrative purposes only and are not meant to limit this invention in any way.

A computer or other electronic or mechanical control system may be used to monitor DUT temperature and provide the necessary adjustment of spray. For example, if the DUT temperature rises, the computer could increase the flow rate, decrease the fluid temperature, or both.

In a further aspect of the invention, a solid immersion lens (SIL) is used in combination with the objective lens. SILs are well known to those skilled in the art and are included here by reference. The SIL enables transmission of optical energy between the DUT and the objective lens regardless of the type and manner of cooling spray used. Thus, the atomizers and the fluid pressure can be selected freely for optimal heat removal efficiency. For example, the size, design/style, density, angle, and number of atomizers can all be adjusted. In addition, the temperature and type of coolant used can also be adjusted.

In a further aspect of the invention, a DUT retention frame is provided with a seal plate that enables sealing contact with a spray chamber. In some arrangements, the seal plate is provided with O-rings preventing cooling fluid from reaching the pin side of the DUT. One possible advantage of the arrangement is that non-dielectric coolants such as water can be used because the coolant does not come in contact with the electrically exposed (front) side of the chip. In other arrangements, the seal plate may have cooling channels provided therein to enable cooling (with dielectric coolants) of the DUT from the pin side, i.e., back side cooling. In yet other arrangements, the DUT retention frame and seal plate may be integrated into an integrated seal plate. One possible advantage of this is that the backside cooling channel can be isolated from the spray side of the DUT. This allows separate cooling systems to be implemented, including the possible use of two different coolants.

In yet a further aspect of the invention, the SIL is in contact with a thermally conductive cover plate which is transparent to the NIR and compatible with the SIL optical design. For example, the cover plate may be made of silicon, sapphire, or diamond. The walls of the chamber are sealed to the cover plate. The cover plate is placed in contact with the DUT and the surface of the window inside the chamber is cooled by the spray mechanism previously described. This aspect may have the advantage that the heat from the DUT is spread out before being extracted by the spray cooling, and that the spray is completely enclosed, avoiding unnecessarily cooling areas around the DUT.

BRIEF DESCRIPTION OF THE DRAWINGS

The invention is described herein with reference to particular embodiments thereof which are exemplified in the drawings. It should be understood, however, that the various embodiments depicted in the drawings are only exemplary and may not limit the invention as defined in the appended claims.

DETAILED DESCRIPTION

Various embodiments and implementations of the present invention can be used in conjunction with various IC testers and probers, so as to provide cooling of an IC that is electrically stimulated. In one general aspect, an atomized liquid spray is provided about a probe head so as to cool the DUT as the probe head collects data. Any probe head may be used, for example, the probe head may be in the form of an optical photon-counting time-resolved receiver, optical emission microscope, or laser-based probing tool. In order to provide a more detailed explanation of various aspects and features of the invention, the invention will be described with reference to more specific IC probers, i.e., optical photon-counting time-resolved emission probers. However, it should be appreciated that such detailed description is provided only as an example and not by way of limitation.

Figure 1:
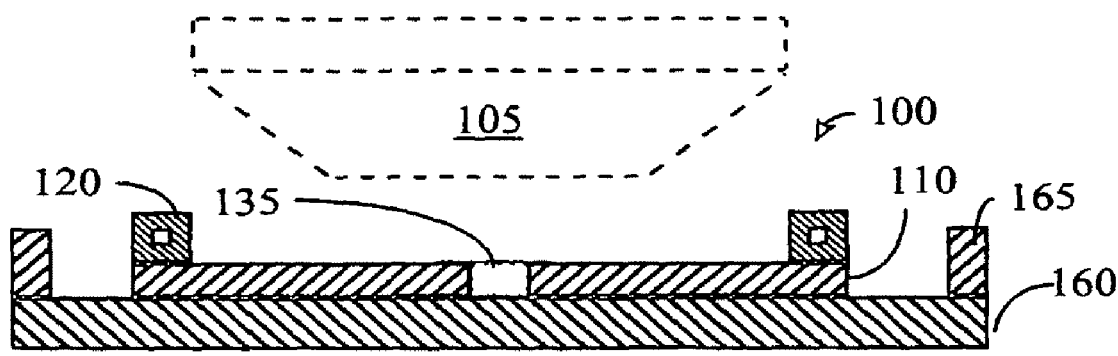
FIG. 1 depicts a plate cooling system according to the prior art.
Figure 2:
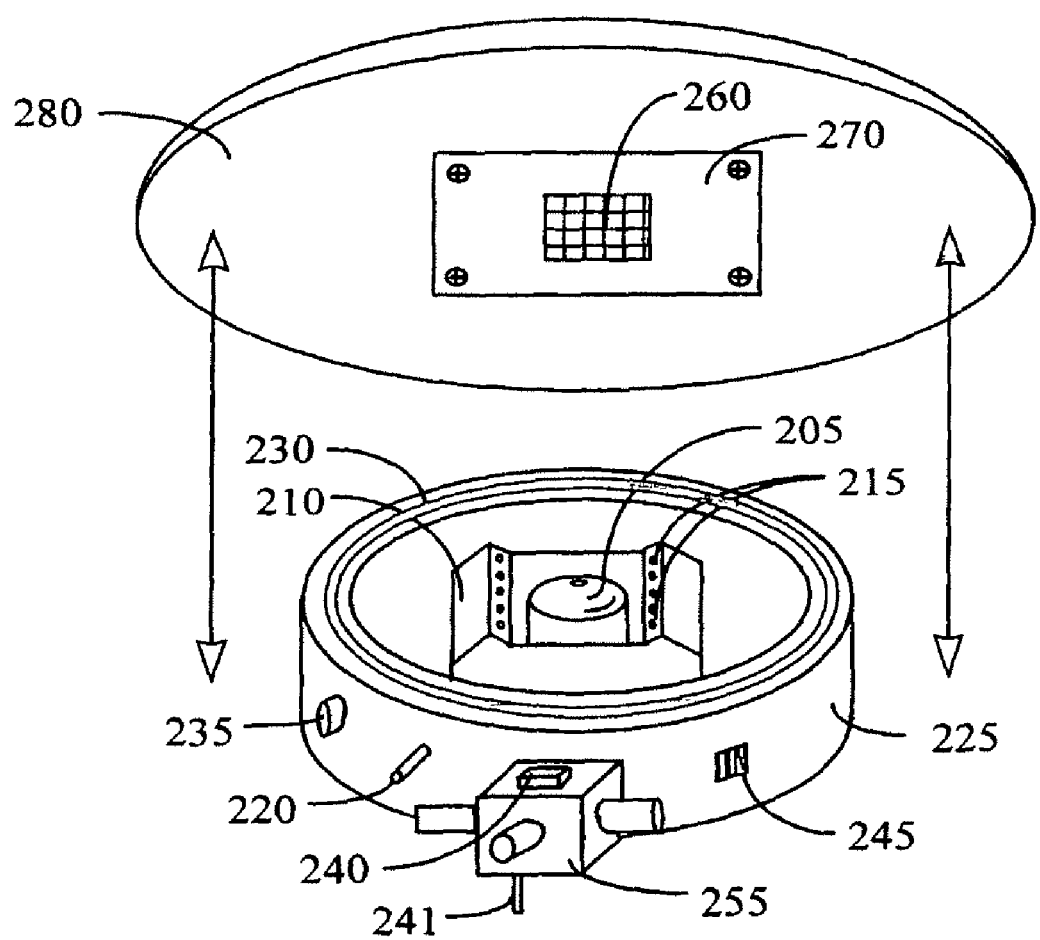
FIG. 2 depicts an embodiment of the inventive cooling system in an exploded view.

FIG. 2 depicts an exploded view of one embodiment of the inventive cooling system. The cooling system depicted in FIG. 2 may be used with any type of microscope used for inspection and/or testing of ICs. For clarity, FIG. 2 shows only the objective lens portion optical inspection/probing system, except for the parts relating to its cooling system. As shown in FIG. 2, a retention frame 270 holds the DUT 260 onto seal plate 280. The seal plate is mounted to a load board, which in turn is connected to a conventional test head (not shown) of a conventional automated testing equipment (ATE). The ATE sends stimulating signals to the DUT 260, to simulate operating conditions of the DUT 260. This is done conventionally using the load board with an appropriate socket for the DUT.

An objective housing 205 houses the objective lens of the testing system. The housing 205 and objective lens generally form an optical receiver of the system, i.e., the probe head. The housing 205 is mounted along with a spray head 210 having atomizers 215 provided therein. This entire assembly is situated inside spray chamber 225, having a seal 230 affixed to its upper surface. The seal 230 may be sliding or otherwise. The spray chamber 225 is affixed to a translation stage, e.g., an x-y-z stage (not shown). To perform testing in an embodiment employing the sliding seal, the spray chamber 225 is brought in contact with the sealing plate 280, so that sliding seal 230 creates a seal with the sealing plate 280. The seal may be hermetic, but a hermetic seal is not required. In this manner, the spray chamber 225 may be moved about so as to bring the objective lens into registration with the particular area of the DUT sought to be imaged, without breaking the seal with the sealing plate 280.

In another embodiment, the housing 225 is connected to the sealing plate 280 through a flexible bellows (not shown). The bellows material should be compatible with the coolant temperature and chemical properties. Some potential materials include folded thin-walled steel and rubber.

During testing, fluid is supplied to the atomizers 215 via coolant supply manifold 255. The boiling point of the coolant can be controlled by controlling the pressure inside the spray chamber 225 using solenoid 220, or otherwise. In one implementation of the invention, the pressure inside the spray chamber 225 is measured using pressure transducer 250 and of that of the coolant supply is measured using pressure transducer 240, while the temperature of the cooling fluid is measured with temperature sensor 241 and of the spray is measured using temperature sensor 245. As a safety measure, a mechanical pressure relief valve 235 is optionally provided.

The coolant delivery pressure is measured by a pressure transducer close to the coolant delivery point 240. The spray chamber pressure is also measured by another pressure transducer 250. For fixed or varying coolant temperature and spray chamber pressure, the measured coolant delivery pressure is fed back to the controller to ensure adequate coolant delivery pressure for a required DUT temperature. The flow rate, and thus the cooling rate, can be controlled by the coolant delivery pressure.

Figure 3:
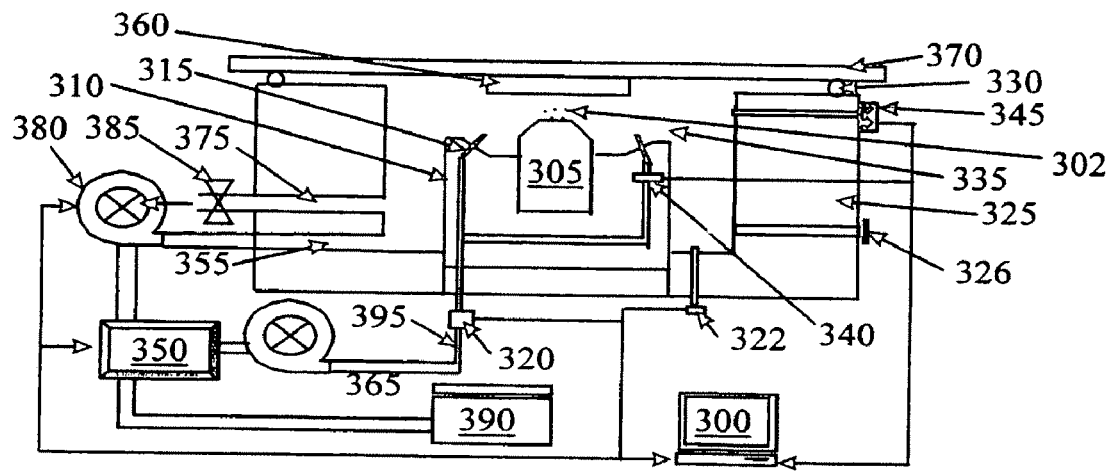
FIG. 3 depicts a cross section schematic of an embodiment of the inventive cooling system.

FIG. 3 is a cross-sectional schematic of the spray cooling system according to an embodiment of the present invention. Specifically, DUT 360 is attached to seal plate 370, which is then mounted to the DUT load board (not shown). The described assembly is affixed to the load board, which is connected to a test adapter in a conventional manner. In this embodiment, spray chamber 325 is pressed against the seal plate 370 so as to form a seal using a sliding seal 330. Objective housing 305 is fitted with spray head 310 and is inserted into spray chamber 325 in a sealed manner. Pump 380 is used to return fluid to the liquid temperature conditioning system, such as a chiller 350, and can also be used to control the pressure inside the chamber interior 335, typically at about 1 atm. It should be understood that the desired spray chamber pressure can be calculated according to the characteristics of the cooling fluid used and the boiling point desired (in a given embodiment).

Pump 365 is used to pump coolant through supply piping 395 to be injected onto the DUT via atomizer banks 315. In one embodiment of the invention, coolant is sprayed onto the stimulated DUT 360, whereupon it is heated to its boiling point and then evaporates and vapor forms in the interior 335. The vapor may then condense on the chamber 325 walls, and is drained through channels 355, back into the pump 380. The vapor may also be directly fed into the chiller 350, although the load on the chiller will be increased. In another embodiment, the coolant simply absorbs the heat from the DUT without evaporating, whereupon the unevaporated liquid is returned to the liquid temperature conditioning system. While two thermal management scenarios have been presented, those skilled in the art can appreciate the fact that the relative cooling strengths of the fluid heat absorption and the evaporation may be adjusted, for example, by choosing different fluids, nozzle design and number, fluid flow rate, fluid temperature, and chamber pressure as described above.

The fluid may then be circulated through the liquid temperature conditioning system 350 before being sprayed again onto the DUT. The coolant used in this embodiment is of high vapor pressure, e.g., hydrofluoroethers or perfluorocarbons. Consequently, such fluids evaporate readily when exposed to atmospheric condition. Therefore, as shown in this embodiment, the entire cooling system forms a closed loop system. The closed system may be vented through the solenoid valve 385, which may also be operated in conjunction with a vapor recovery system such as a reflux condenser to mitigate additional vapor loss. For this purpose, the liquid temperature conditioning system 350 comprises a sealed chiller reservoir 390, capable of operating at both high and low pressures, i.e., 10 psi above atmospheric pressure or a full vacuum of −1 atm. The reservoir 390 may also include a fluid agitation system (not shown) to enhance heat transfer from the coolant to the chiller coils (not shown). In this example, the chiller 350 and reservoir 390 are capable of operating at low temperatures of down to, for example, −80° C.

Using this system, the temperature of the DUT can be varied so as to be tested under various operating conditions. For example, the operator may input a certain operating temperature for testing the DUT. In one embodiment, the actual temperature of the DUT can be detected by the ATE (not shown) in a manner known to those skilled in the art. For example, a temperature diode may be embedded in the DUT, and its signal sent to the ATE. This is conventionally done for safety reasons such as, for example, to shut the system if the DUT gets too hot. However, according to this embodiment of the invention, the temperature of the DUT is sent from the ATE to the controller 300. Using the actual DUT temperature, the controller 300 adjusts the cooling rate so as to operate the DUT at the temperature selected by the operator. To control the cooling rate, the controller 300 may adjust, for example, the flow rate of coolant, the temperature of the coolant, or change the pressure in the chamber so as to change the boiling point of the cooling liquid.

As shown in FIGS. 2 and 3, and as alluded to above, various sensors and instrumentation may be used to control the operation of the inventive cooling system. A pressure transducer 320 measures the coolant delivery pressure so as to control the pump 365 speed. Additionally, a pressure transducer 322 measures the pressure inside the spray chamber so as to control a solenoid valve 385 to obtain the appropriate coolant boiling point inside the spray chamber. Temperature sensor 340 is used to measure the coolant temperature close to the point of delivery, while the vapor temperature in the spray chamber is measured with temperature sensor 345. Notably, from the spray chamber pressure and the vapor temperature (or coolant at its saturation temperature), it is possible to determine the thermodynamic state of the coolant delivered to the stimulated DUT. A mechanical pressure relief valve 326 provides a safety release in the event that the solenoid valve 385 fails.

In the embodiments of FIGS. 2 and 3, the effects of the atomized coolant on imaging needs to be minimized. One way to do this is by using the optional shield 302, so as to prevent the mist from entering the optical axis of the imaging system. In this manner, when the objective housing is moved in to image a particular area on the DUT, the shield can be made to touch, or to be very close, to the DUT so as to shield that area of the DUT from the mist. On the other hand, if one wishes to avoid the use of the shield, then the spray needs to be adjusted to enable best imaging under the wavelength of the light being used. That is, the droplet size of the mist needs to be controlled depending on the operation of the microscope. For example, imaging may be done using, for example, white light, or emission may be detected using, for example, infrared light. These different wavelengths would result in better image by appropriate selection of the droplet size of the mist. This can be selected beforehand, or by the operator during testing.

On the other hand, in a further aspect of the invention, an improved imaging is obtained using a solid immersion lens (SIL) in combination with the objective lens. The SIL enables transmission of optical energy between the DUT and the objective lens practically regardless of the type and manner of cooling spray used. Thus, the atomizers and the fluid pressure can be selected for optimal heat removal efficiency.

Figure 4:
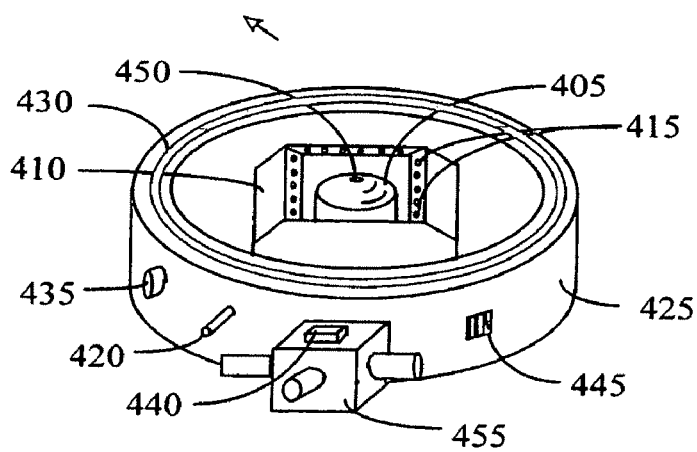
FIG. 4 depicts an embodiment of the inventive cooling system using a solid immersion lens.

Solid immersion lenses (SIL) are well known in the art and are described in, for example, U.S. Pat. Nos. 5,004,307, 5,208,648, and 5,282,088, which are incorporated herein by reference. FIG. 4 depicts an embodiment of the cooling system of the invention used in conjunction with a SIL. As exemplified in FIG. 4 many of the elements of this embodiment are similar to those of the embodiments of FIGS. 2 and 3. However, in this embodiment, a SIL 450 is affixed to the tip of the objective housing 405. In operation, the SIL 450 is "coupled" to the DUT, so as to allow communication of evanescent wave energy. In other words, the SIL is coupled to the DUT so that it captures rays propagating in the DUT at angles higher than the critical angle (the critical angle is that at which total internal reflection occurs). As is known in the art, the coupling can be achieved by, for example, physical contact with the imaged object, very close placement (up to about 20-200 micrometers) from the object, or the use of index matching material or fluid. In addition to increasing the efficiency of light collection, the use of SIL 450 also prevents, or dramatically reduces, any deleterious effects of the mist on the image because the mist cannot intervene between the SIL and the DUT.

In the embodiment of FIG. 2, two banks of atomizers are used. On the other hand, in the embodiment of FIG. 4, four banks of atomizers are used. It should be appreciated, however, that the number of atomizers and the number of banks of atomizers are provided only as examples, and other numbers and arrangements may be used. For example, the atomizers may be placed in a circular arrangement about the objective housing, rather than in linear banks. Similarly, the atomizers may be attached directly to any optical receiver used, e.g., objective lens housing, rather than placed in a spray head. Furthermore, various injectors may be operated at different spray rates or be provided with different cooling fluid, or same cooling fluid, but at different temperature. Optionally, different spray heads may be adjusted to provide spray at different angles.

Figure 5:
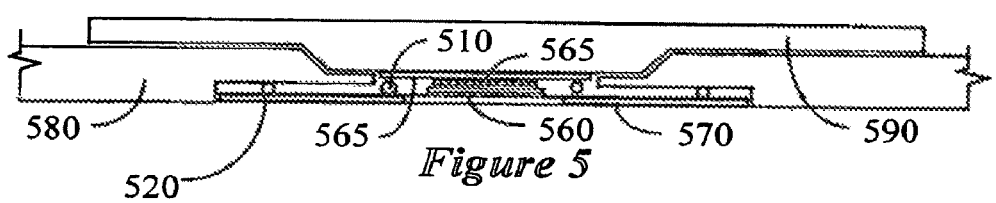
FIG. 5 is a cross section schematic of a DUT holder arrangement according to an embodiment of the inventive cooling system allowing the use of non-dielectric fluids such as water.

In the embodiments described above, a conventional tester head adapter is used to mount the DUT. An exemplary arrangement of mounting the DUT is depicted in FIG. 5. The DUT 560 is mounted onto the DUT board 590 and held in place by retention frame 570. To prevent fluid from reaching the electrical contacts of the DUT, an o-ring seal 510 is located between the DUT retention frame 570 and the DUT carrier 565. In addition, an o-ring seal 520 is provided between the DUT retention frame 570 and the seal plate 580. In this manner, non-dielectric coolants such as water may be used without altering the electrical behavior of the DUT because the non-dielectric coolant does not come in contact with the electrical pins.

Figure 6:
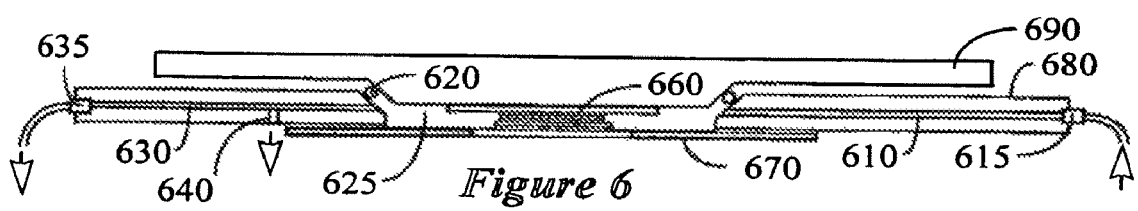
FIG. 6 is a cross section schematic of a DUT holder arrangement according to another embodiment of the inventive cooling system allowing additional cooling of the DUT through the pin side.

FIG. 6 depicts another embodiment of a cooling system of the invention. In this embodiment, the electrical pin side of the DUT is being cooled, i.e., backside cooling. In this embodiment, a fluid coupler 615 is provided on the integrated seal plate 680, enabling connection to a source of cooling fluid. Channel 610 is provided in the integrated seal plate 680 (now shown to incorporate the DUT retention frame 670), enabling the input fluid to reach the space 625 and get to the DUT's electrical pins, i.e., enabling heat removal from the pin side of the DUT. An o-ring sealer 620 is provided to avoid fluid flow in between seal plate 680 and DUT board 690. Various options are demonstrated for removal of the fluid from the space 625. One example is using output channel 630 to pump the fluid and output it to the chiller via coupler 635. This option enables operation of this cooling system independently of any other cooling system provided. A second example is to provide an output port 640. Output port 640 can be used to output the fluid into a spray chamber, such as any of FIGS. 2-4. In this manner, a single chiller may be used for both cooling systems. Of course, both examples may be used concurrently.

Figure 7:
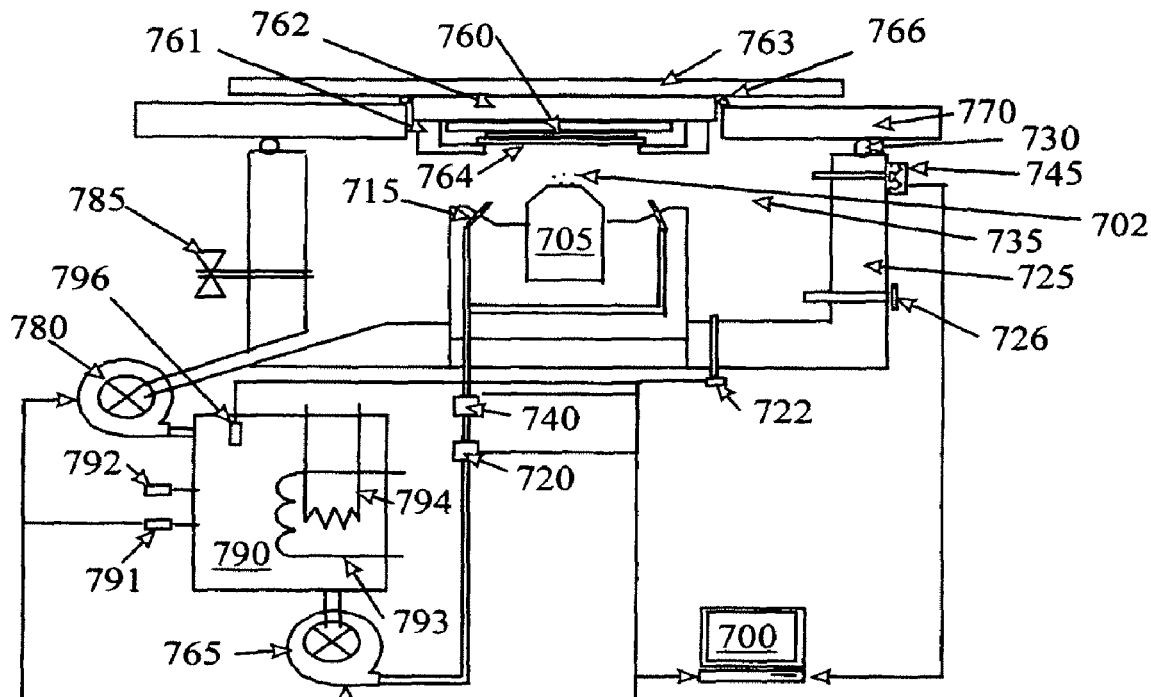
FIG. 7 depicts a cross section schematic of an embodiment of the inventive cooling system.

A further embodiment of the inventive spray cooling system is depicted in FIG. 7. The DUT 760 is held against the socket 762 by the retention frame 761. In this particular example, the retention frame 761 is separate from the seal plate 770, but as shown in other embodiments herein, these two parts can be made as a single unit. Also, an optional seal 766 is provided between seal plate 770, socket 762, and DUT board 763. This ensures that no vapor will escape in the space between these parts.

The spray chamber 725 is held against the seal plate 770 so that seal 730 makes a seal with the seal plate 770. Atomizer banks 715 are provided about objective housing 705. The condition inside chamber interior 735 is monitored using pressure transducer 722 and temperature sensor 745. The pressure inside chamber interior 735 is controlled using solenoid valve 785. Additionally, a mechanical pressure relief valve 726 is provided for safety.

Cooling fluid is provided to the atomizer banks 715 using supply pump 765. The pressure of the delivered fluid is measured by pressure transducer 720, and the temperature is measured by temperature sensor 740. After being sprayed, the fluid is collected and is pumped back to chiller reservoir 790 using return pump 780. The fluid level inside the chiller is monitored by level sensor 796, which can also be used as an added variable for thermal management control, while the pressure inside the chiller is monitored by pressure transducer 791. A mechanical pressure relief valve 792 is provided for safety. The temperature of the fluid inside the chiller is controlled using chiller coils 793 and heater 794. As shown, all the sensors, actuators, and pumps are connected to computer/controller 700.

As is known, in order to inspect the DUT, it is customary to thin the DUT. Consequently, when devices generate heat, the heat does not spread well over the entire DUT and a localized heat spot is created. If spray cooling is used to spray directly onto the DUT, the spray may immediately evaporate and create a gaseous layer over the localized heat spot thereby preventing further spray from reaching and cooling that spot. To avoid that, in the embodiment of FIG. 7 a transparent cooling plate 764 is provided over the DUT 760, so as to enhance spreading of heat from localized heat spots. The spray is then applied on the cooling plate, which may be made from, for example, silicon, sapphire, or diamond.

Figure 8:
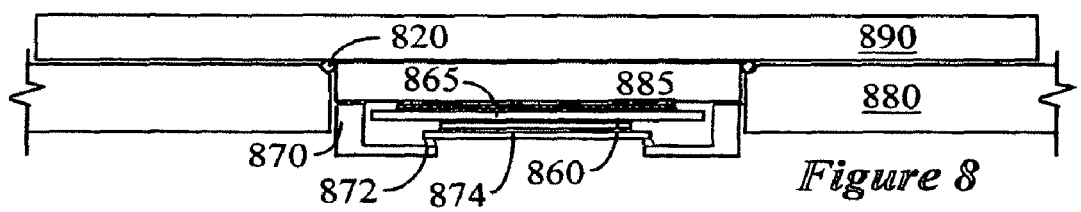
FIG. 8 is a cross section schematic of a DUT holder arrangement with separate DUT retention frame and seal plate.

FIG. 8 is a cross section schematic of a DUT holder arrangement with separate DUT retention frame 870 and seal plate 880. The DUT 860 is held against socket 885 by retention frame 870. An o-ring 820 is provided between DUT board 890, socket 885, and seal plate 880. Note that in this schematic DUT 860 is depicted as substrate 860 and encapsulation 865. Also, the optional transparent cooling plate 874 is depicted covering the DUT 860. The transparent cooling plate 874 may be sealed to the retention frame 870 by, for example, indium or epoxy bonding, silicon sealant, and the likes.

Figure 9:
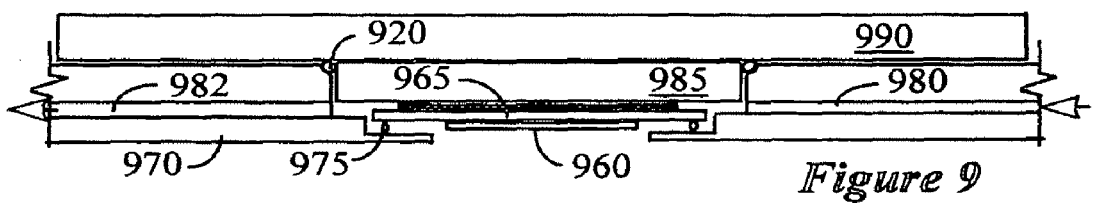
FIG. 9 is a cross section schematic of a DUT holder arrangement with integrated DUT retention frame and seal plate and employing independent backside cooling.

FIG. 9 is a cross section schematic of a DUT holder arrangement with integrated DUT retention frame and seal plate 970, and employing independent backside cooling. That is, in this embodiment, the backside cooling is independent of the spray cooling, so that different fluid or different fluid temperature can be used for the backside cooling. Notably, in this arrangement, an o-ring seal 975 is provided between the DUT carrier 965 and the integrated seal plate 970. Another o-ring seal 920 is provided between the DUT board 990, socket 985, and integrated seal plate 970. One or more channels 980 are provided in integrated seal plate 970 to provide cooling fluid to the backside of the DUT 960. Similarly, one or more channels 982 are provided in seal plate 970 to remove cooling fluid from the backside of the DUT.

Figure 10:
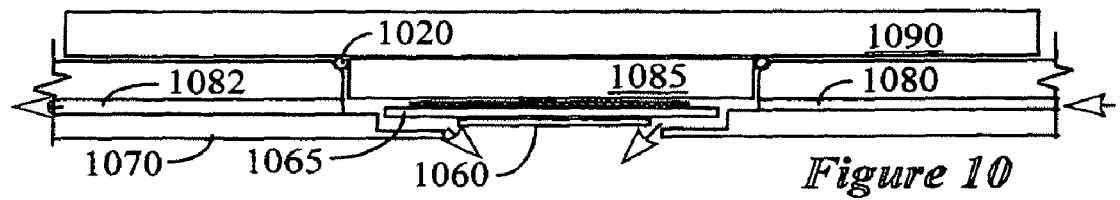
FIG. 10 is a cross section schematic of a DUT holder arrangement with integrated DUT retention frame and seal plate and employing backside cooling.

FIG. 10 is a cross section schematic of a DUT holder arrangement with integrated DUT retention frame and seal plate 1070, and employing backside cooling. The DUT 1060 is held against the socket 1085 by integrated retention frame/seal plate 1070. An o-ring seal is provided between the DUT board 1090, socket 1085, and seal plate 1070. One or more channels 1080 are provided in seal plate 1070 so as to provide cooling fluid to the backside of the DUT 1060. Similarly, one or more channels 1082 are provided in seal plate 1070 so as to remove cooling fluid from the backside of DUT 1060. As shown by the arrows in FIG. 10, since no seal is provided between the DUT carrier 1065 and seal plate 1070, cooling fluid may be drained in the space between the DUT carrier 1065 and the seal plate 1070.

In all of the embodiments discussed above, a retention frame is used to secure the DUT in the socket. As has already been discussed, for any of these embodiments the retention frame may either be a separate component, as shown in FIGS. 5 and 8, or it may be integrated with the DUT seal plate, as shown in FIGS. 6, 9 and 10.

While the invention has been described with reference to particular embodiments thereof, it is not limited to those embodiments. Specifically, various variations and modifications may be implemented by those of ordinary skill in the art without departing from the invention's spirit and scope, as defined by the appended claims. Additionally, all of the above-cited prior art references are incorporated herein by reference.

What is claimed is:

1. A method for controlling operating temperature of an IC undergoing testing and having a thinned substrate, comprising:
   a. providing a cooling chamber about the IC;
   b. applying electrical test signals to the IC;
   c. circulating cooling fluid through a fluid temperature conditioning system;
   d. providing the cooling fluid to said cooling chamber so as to spray the cooling fluid onto at least a portion of the thinned substrate of the IC; and,
   e. sensing optical signals from said IC as cooling fluid is sprayed onto at least a portion of the thinned substrate of the IC.

2. The method of claim 1, further comprising providing a cooling plate to cover the thinned substrate of the IC, such that in step d, the cooling fluid is sprayed onto at least a portion of the cooling plate.

3. The method of claim 2, wherein the cooling plate comprises transparent material.

4. The method of claim 1, further comprising collecting cooling fluid sprayed onto the IC, and delivering collected cooling fluid to the temperature conditioning system.

5. The method of claim 1, further comprising: measuring the pressure inside the cooling chamber and controlling cooling fluid delivery according to the measured pressure.

6. The method of claim 1, further comprising: measuring the temperature of at least one of the cooling fluid, the cooling chamber, and the IC, and controlling cooling fluid delivery according to the temperature.

7. The method of claim 1, further comprising measuring the cooling fluid level within a chiller reservoir and controlling cooling fluid delivery according to the measured cooling fluid level.

8. The method of claim 1, further comprising providing a seal between the cooling chamber and the IC.

9. The method of claim 1, further comprising providing a solid immersion lens (SIL) to collect the optical signals from the IC, and providing a shield about the SIL.

10. The method of claim 1, further comprising providing a cooling head inside the cooling chamber.

11. The method of claim 1, further comprising shielding off a portion of the IC from the cooling fluid.

12. The method of claim 1, wherein providing the cooling fluid comprises applying the cooling fluid to a plurality of nozzles or a plurality of atomizers.

13. The method of claim 11, wherein providing the cooling fluid is adjusted so as to cause at least part of the cooling fluid to evaporate upon contacting the IC.

\* \* \* \* \*